(12) United States Patent
Yue

(10) Patent No.: US 10,863,640 B2
(45) Date of Patent: Dec. 8, 2020

(54) PACKAGING STRUCTURE AND PACKAGING METHOD

(71) Applicant: HUIZHOU CHINA STAR OPTOELECTRONICS TECHNOLOGY CO., LTD., Guangdong (CN)

(72) Inventor: Liang Yue, Guangdong (CN)

(73) Assignee: HUIZHOU CHINA STAR OPTOELECTRONICS TECHNOLOGY CO., LTD, Guangdong (CN)

(*) Notice: Subject to any disclaimer, the term of this patent is extended or adjusted under 35 U.S.C. 154(b) by 0 days.

(21) Appl. No.: 15/757,983

(22) PCT Filed: Feb. 11, 2018

(86) PCT No.: PCT/CN2018/076267
§ 371 (c)(1),
(2) Date: Mar. 7, 2018

(87) PCT Pub. No.: WO2019/144446
PCT Pub. Date: Aug. 1, 2019

(65) Prior Publication Data
US 2020/0352042 A1  Nov. 5, 2020

(30) Foreign Application Priority Data
Jan. 26, 2018 (CN) .......................... 2018 1 0075847

(51) Int. Cl.
*H05K 5/02* (2006.01)
*H05K 5/00* (2006.01)

(52) U.S. Cl.
CPC ......... *H05K 5/0217* (2013.01); *H05K 5/0017* (2013.01)

(58) Field of Classification Search
CPC .......................... H05K 5/0217; H05K 5/0017
USPC ...................................... 361/679.01
See application file for complete search history.

(56) References Cited

U.S. PATENT DOCUMENTS

| | | | |
|---|---|---|---|
| 6,006,911 A | 12/1999 | Levy | |
| 2013/0104504 A1 | 5/2013 | Hu | |
| 2013/0292295 A1 | 11/2013 | Zhao | |
| 2016/0365537 A1* | 12/2016 | Qian | ............. H01L 51/5253 |
| 2016/0365538 A1* | 12/2016 | Qian | ................ H01L 51/56 |

(Continued)

FOREIGN PATENT DOCUMENTS

| | | |
|---|---|---|
| CN | 101058360 A | 10/2007 |
| CN | 201132621 Y | 10/2008 |
| CN | 102502105 A | 6/2012 |

(Continued)

*Primary Examiner* — Sherman Ng
(74) *Attorney, Agent, or Firm* — Soroker Agmon Nordman

(57) ABSTRACT

The present invention provides a packaging structure and a packaging method, the packaging structure includes a first flat plate portion, a second flat plate portion, a folding portion connected between the first flat plate portion and the second flat plate portion, and a fastening structure to fasten the first flat plate portion and the second flat plate portion, the folding portion is configured to fold the first flat plate portion and the second flat plate portion to make a display panel sandwiched between the buffer layer of the first flat plate portion and the buffer layer of the second flat plate portion.

20 Claims, 8 Drawing Sheets

(56) References Cited

U.S. PATENT DOCUMENTS

2017/0271616 A1* 9/2017 Choi ................... H01L 51/529
2018/0309088 A1* 10/2018 Gong ................. H01L 51/5253

FOREIGN PATENT DOCUMENTS

| CN | 102658905 A | 9/2012 |
| CN | 203111791 U | 8/2013 |
| CN | 103274122 A | 9/2013 |
| CN | 103303585 A | 9/2013 |
| CN | 103879628 A | 6/2014 |

* cited by examiner

PACKAGING STRUCTURE AND PACKAGING METHOD

BACKGROUND OF INVENTION

Field of Invention

The present invention relates to displays, and particularly to a packaging structure and a packaging method configured to package a display panel.

Description of Prior Art

In conventional technology, referring to FIG. 1, because a display panel 20 is borderless or has narrow borders, a distance between a printed circuit board 202 and a panel body 201 is too small. Because outer lead bonding are covered by rubber coverings, an area of the outer lead bonding cannot be acted by external forces. When the display panel 20 is placed in a packaging box 30, a retaining wall cannot be placed at a side of the area the outer lead bonding. During transport, the panel body 201 moves correspondingly to the printed circuit board 202, and a flexible printed circuit board 203 and chips arranged on the flexible printed circuit board 203 can break. Therefore, it is necessary to provide a packaging structure and a packaging method, the packaging structure and the packaging method are configured to package a display panel, and the packaging structure is used for protecting the display panel.

SUMMARY OF INVENTION

The application mainly provides a packaging structure and a packaging method configured to package a display panel and to protect the display panel.

A packaging structure, the packaging structure being configured to package a display panel, the packaging structure comprises:

a first flat plate portion, a second flat plate portion, a folding portion and a fastening structure, wherein both the first flat plate portion and the second flat plate portion have a substrate layer and a buffer layer, wherein the buffer layer is formed on the substrate layer;

the folding portion is connected between the first flat plate portion and the second flat plate portion, the folding portion is configured to fold the first flat plate portion and the second flat plate portion to make the display panel sandwiched between the buffer layer of the first flat plate portion and the buffer layer of the second flat plate portion;

the fastening structure comprises a first fastening portion and a second fastening portion fastened to the first fastening portion, the first fastening portion is formed at one side of the first flat plate portion, the second fastening portion is formed at one side of the second flat plate portion;

the buffer layer of the first flat plate portion and the buffer layer of the second flat plate portion are connected with each other at the folding portion; and the substrate layer of the first flat plate portion and the substrate layer of the second flat plate portion are not connected with each other at the folding portion.

In the packaging structure of this application, the first fastening portion comprises a first extending portion, the second fastening portion comprises a second extending portion, the second extending portion comprises an inserting portion, the inserting portion comprises a fixing end connected to the second extending portion and a free end extending from the fixing end, a length of the inserting portion is greater than a distance between the fixing end and a sidewall of the first extending portion facing the second extending portion.

In the packaging structure of this application, the fixing end of the inserting portion is formed at a sidewall of the second extending portion facing the first extending portion.

In the packaging structure of this application, the second extending portion comprises a through hole, the through hole is formed through the substrate layer and the buffer layer, the fixing end is formed at a sidewall of the through hole closed to the first extending portion.

In the packaging structure of this application, a U-shaped slit is formed at the second extending portion, the U-shaped slit has an opening facing the first extending portion, the fixing end is connected to the opening, the free end faces a sidewall of the U-shaped slit opposite to the opening.

In the packaging structure of this application, the first extending portion further comprises a penetrating hole, the penetrating hole is formed through the substrate layer and the buffer layer.

A packaging structure, the packaging structure being configured to package a display panel, wherein the packaging structure comprises:

a first flat plate portion, a second flat plate portion, a folding portion and a fastening structure, wherein both the first flat plate portion and the second flat plate portion have a substrate layer and a buffer layer, wherein the buffer layer is formed on the substrate layer;

the folding portion is connected between the first flat plate portion and the second flat plate portion, the folding portion is configured to fold the first flat plate portion and the second flat plate portion to make the display panel sandwiched between the buffer layer of the first flat plate portion and the buffer layer of the second flat plate portion;

the fastening structure comprises a first fastening portion and a second fastening portion fastened to the first fastening portion, the first fastening portion is formed at one side of the first flat plate portion, the second fastening portion is formed at one side of the second flat plate portion.

In the packaging structure of this application, the first fastening portion comprises a first extending portion, the second fastening portion comprises a second extending portion, the second extending portion comprises an inserting portion, the inserting portion comprises a fixing end connected to the second extending portion and a free end extending from the fixing end, a length of the inserting portion is greater than a distance between the fixing end and a sidewall of the first extending portion facing the second extending portion.

In the packaging structure of this application, the fixing end of the inserting portion is formed at a sidewall of the second extending portion facing the first extending portion.

In the packaging structure of this application, the second extending portion comprises a through hole, the through hole is formed through the substrate layer and the buffer layer, the fixing end is formed at a sidewall of the through hole closed to the first extending portion.

In the packaging structure of this application, a U-shaped slit is formed at the second extending portion, the U-shaped slit has an opening facing the first extending portion, the fixing end is connected to the opening, the free end faces a sidewall of the U-shaped slit opposite to the opening.

In the packaging structure of this application, the first extending portion further comprises a penetrating hole, the penetrating hole is formed through the substrate layer and the buffer layer.

A packaging method configured to packaging a display panel, comprises:

providing a display panel;

providing a packaging structure, wherein the packaging structure comprises a first flat plate portion, a second flat plate portion, a folding portion and a fastening structure;

wherein both the first flat plate portion and the second flat plate portion have a substrate layer and a buffer layer, the buffer layer is formed on the substrate layer, the folding portion is connected between the first flat plate portion and the second flat plate portion, the folding portion is configured to fold the first flat plate portion and the second flat plate portion to make the display panel sandwiched between the buffer layer of the first flat plate portion and the buffer layer of the second flat plate portion, the fastening structure comprises a first fastening portion and a second fastening portion fastened to the first fastening portion, the first fastening portion is formed at one side of the first flat plate portion, the second fastening portion is formed at one side of the second flat plate portion;

putting the display panel on the first flat plate portion of the packaging structure, and placing the display panel on the buffer layer;

folding the second flat plate portion to the first flat plate portion along the folding portion to make the buffer layer of the second flat plate portion attach to one side of the display panel away from the first flat plate portion; and fastening the first fastening portion and the second fastening portion of the fastening structure.

In the packaging method of this application, the first fastening portion comprises a first extending portion, the second fastening portion comprises a second extending portion, the second extending portion comprises an inserting portion, the inserting portion comprises a fixing end connected to the second extending portion and a free end extending from the fixing end, a length of the inserting portion is greater than a distance between the fixing end and a sidewall of the first extending portion facing the second extending portion, and the step of fastening the first fastening portion and the second fastening portion of the fastening structure is:

moving the free end of the inserting portion from one side of the first flat plate portion facing the buffer layer, through a gap between the first extending portion and the second extending portion, and to one side of the first flat plate portion facing the substrate layer.

In the packaging method of this application, the first extending portion further comprises a penetrating hole, the penetrating hole is formed through the substrate layer and the buffer layer, and the step of fastening the first fastening portion and the second fastening portion of the fastening structure further comprises:

moving the free end of the inserting portion from the side of the first flat plate portion facing the substrate layer, through the penetrating hole, and to the side of the first flat plate portion facing the buffer layer.

The application provides a packaging structure and a packaging method, the packaging structure comprises a first flat plate portion, a second flat plate portion, a folding portion and a fastening structure. Both the first flat plate portion and the second plate portion have a substrate layer and a buffer layer. The buffer layer is formed on the substrate layer. The folding portion is connected between the first flat plate portion and the second flat plate portion. The first flat plate portion and the second flat plate portion are folded along the folding portion to make a display panel sandwiched between the buffer layer of the first flat plate portion and the buffer layer of the second flat plate portion. The substrate layer is used to support the display panel, and the buffer layer is used to reduce a force between the substrate layer and the display panel. The fastening structure fastens the first flat plate portion and the second flat plate portion to immobilize the first flat plate portion and the second flat plate portion and to ensure a stability of the packaging structure, and to immobilize a panel body of the display panel, a flexible printed circuit board and a print circuit board to avoid breaking the flexible printed circuit board and chips arranged on the flexible printed circuit board and to protect the display panel.

BRIEF DESCRIPTION OF DRAWINGS

In order to describe clearly the embodiment in the present disclosure or the prior art, the following will introduce the drawings for the embodiment shortly. Obviously, the following description is only a few embodiments, for the common technical personnel in the field it is easy to acquire some other drawings without creative work.

DETAILED DESCRIPTION OF PREFERRED EMBODIMENTS

Figure 1:
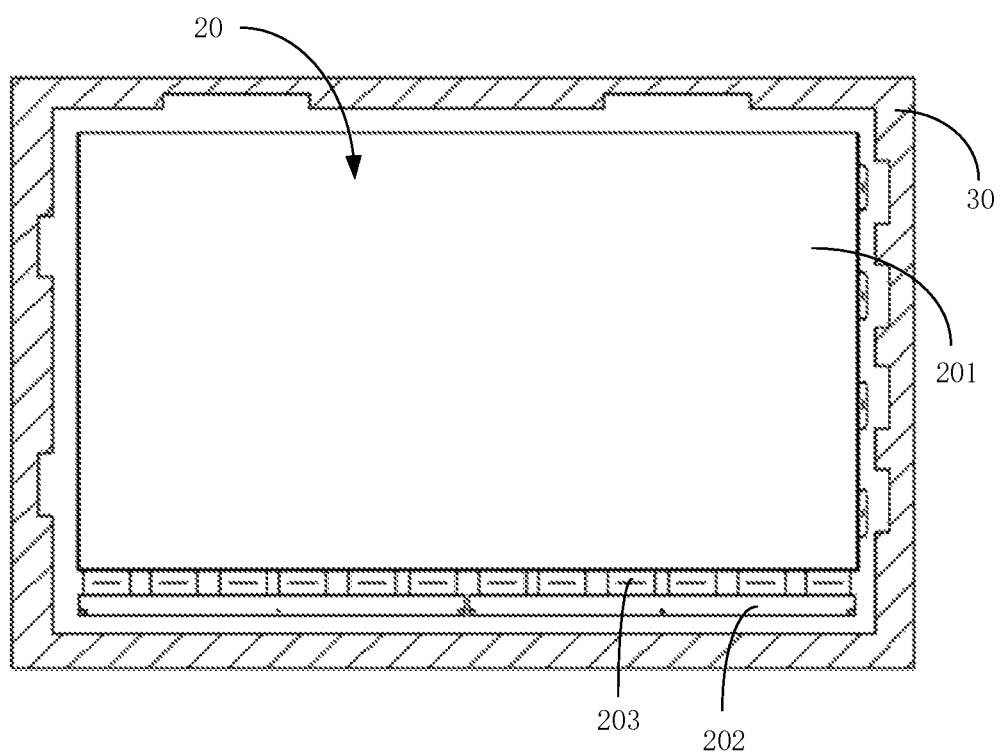
FIG. 1 is a structural diagram of a display panel placed in a packaging box of a conventional technology.

The description of following embodiment, with reference to the accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to the orientation of the accompanying drawings. Therefore, the used directional terms are intended to illustrate, but not to limit, the present disclosure. In the drawings, the components having similar structures are denoted by same numerals.

Figure 2:
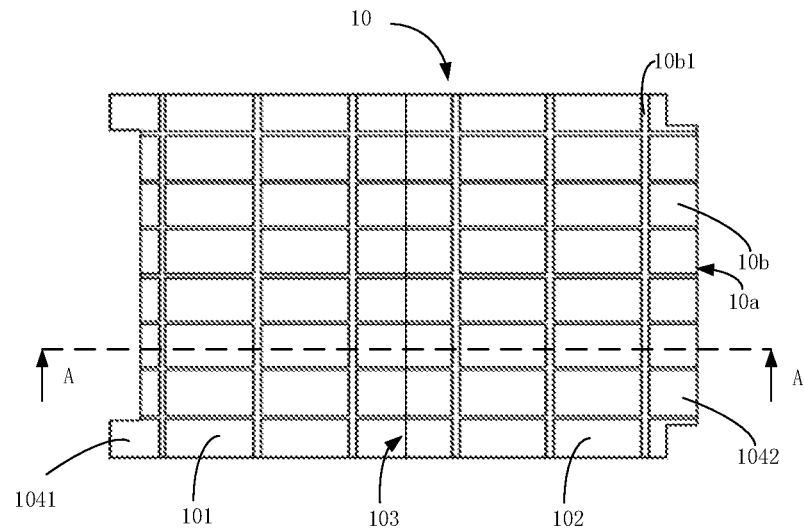
FIG. 2 is a top view of a packaging structure of the present disclosure.
Figure 3:
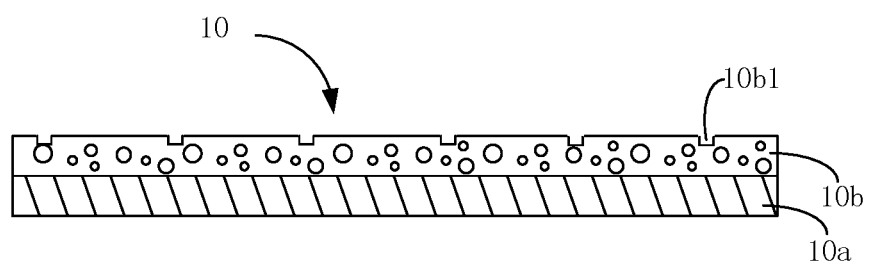
FIG. 3 is a cross-sectional view of a first exemplary embodiment of the packaging structure of FIG. 2 taken along A-A.
Figure 4:
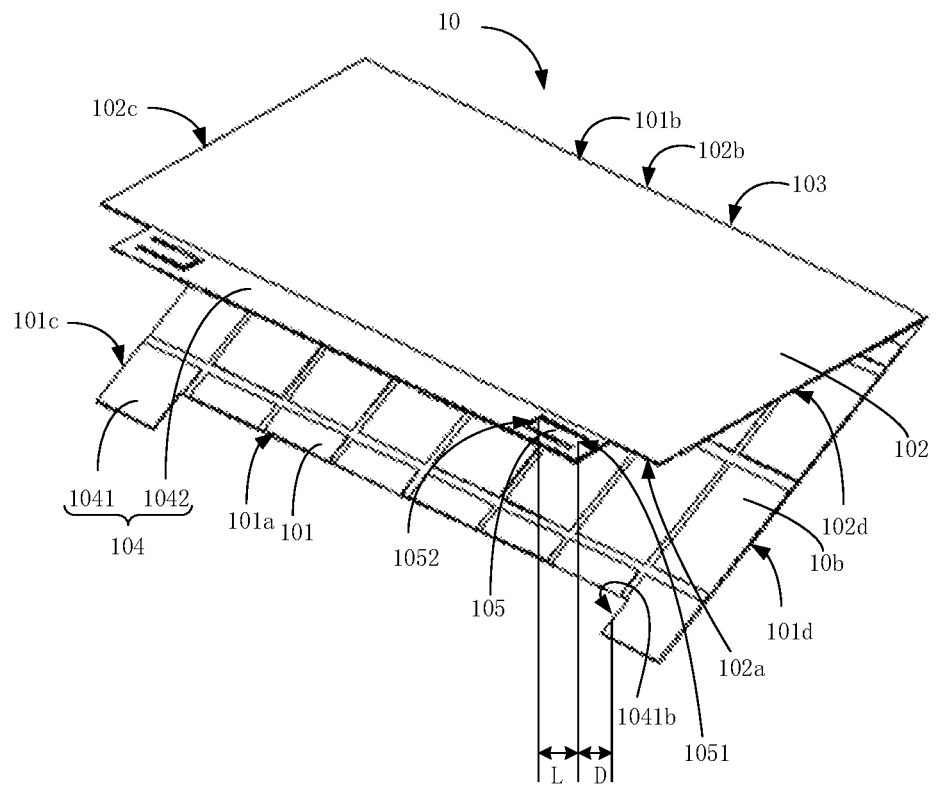
FIG. 4 is a structural diagram of after folding a first flat plate portion and a second flat plate portion of a packaging structure according to a first exemplary embodiment of the present disclosure.

Referring to FIGS. 2-4, this application provides a packaging structure 10 configured to package a display panel.

The packaging structure 10 comprises a first flat plate portion 101, a second flat plate portion 102, a folding portion 103 and a fastening structure 104. Both the first flat plate portion 101 and the second flat plate portion 102 have a substrate layer 10a and a buffer layer 10b.

The substrate layer 10a is made of hard materials. The substrate layer 10a can be made of one or a combination of polyethylene terephthalate (PET), polystyrene (PS), and polyvinyl chloride (PVC). The buffer layer 10b is made of flexible materials. The buffer layer 10b can be made of expanded polyethylene (PE). The packaging structure 10 can be made from the substrate layer 10a and the buffer layer 10b by hot pressing.

The folding portion 103 is connected between the first flat plate portion 101 and the second flat plate portion 102. The folding portion 103 is used to fold the first flat plate portion and the second flat plate portion to make the display panel sandwiched between the buffer layer 10b of the first flat plate portion 101 and the buffer layer 10b of the second flat plate portion 102.

In detail, the display panel is placed on the packaging structure 10, and the display panel attaches to the buffer layer 10b. The substrate layer 10a is used to support the display panel, and the buffer layer 10b is used as a buffer between the substrate layer 10a and the display panel to reduce a force between the substrate layer 10a and the display panel and to protect the display panel.

The buffer layer 10b can have a plurality of channels 10b1 formed through sidewalls of the buffer layer 10b. The channels 10b1 connected with each other. When the display panel attaches to the buffer layer 10b, the channels 10b1 avoids a vacuum generated between the display panel and the buffer layer 10b and avoids a force between the display panel and the buffer layer 10b generated by the vacuum to protect the display panel.

The first flat plate portion 101 comprises a first edge 101a, a second edge 101b, a third edge 101c, and a fourth edge 101d. The first edge 101a is placed opposite to the second edge 101b. The third edge 101c is placed opposite to the fourth edge 101d. The second flat plate portion 102 comprises a first edge 102a, a second edge 102b, a third edge 102c and a fourth edge 102d. The first edge 102a is placed opposite to the second edge 102b. The third edge 102c is placed opposite to the fourth edge 102d. The folding portion 103 is connected between the second edge 101b of the first flat plate portion 101 and the second edge 102b of the second flat plate portion 102.

Figure 5:
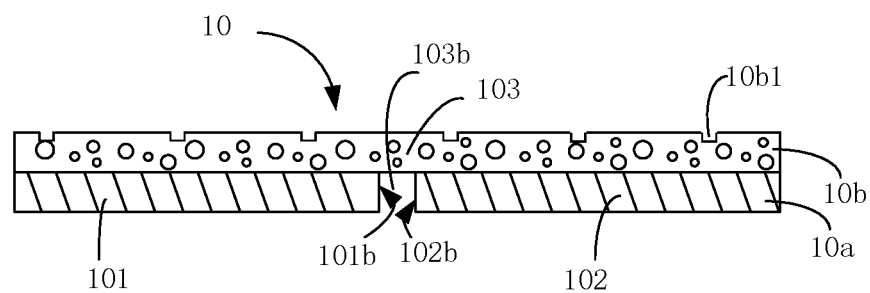
FIG. 5 is a cross-sectional view of a second exemplary embodiment of the packaging structure of FIG. 2 taken along A-A.

In this exemplary embodiment, the folding portion 103 can be an indentation defined on a plate structure, the first flat plate portion 101 is defined at one side of the indentation, and the second flat plate portion 102 is defined at another side of the indentation. The second edge 101b of the first flat plate portion 101 is coincided to the second edge 102b of the second flat plate portion 102. In another exemplary embodiment, referring to FIG. 5, the buffer layer 10b of the first flat plate portion 101 and the buffer layer 10b of the second flat plate portion 102 are connected with each other at the folding portion 103. The substrate layer 10a of the first flat plate portion 101 and the substrate layer 10a of the second flat plate portion 102 are not connected with each other at the folding portion 103. A gap 103a is defined between the second edge 101b of the first flat plate portion 101 and the second edge 102b of the second flat plate portion 102.

The fastening structure 104 comprises a first fastening portion 1041 and a second fastening portion 1042 fastened to the first fastening portion 1041. The first fastening portion 1041 is formed at the first flat plate portion 101. The second fastening portion 1042 is formed at the second flat plate portion 102. In this exemplary embodiment, the number of the fastening structures 104 is two. Both two of the first fastening portions 1041 are formed at the first edge 101a of the first flat plate portion 101. Both two of the second fastening portions 1042 are formed at the first edge 102a of the second flat plate portion 102. Two of the second fastening portions 1042 are connected with each other. In other exemplary embodiments, the number of the fastening structures 104 can be three, four, or eight. The fastening structure 104 can be formed at the third edge 101c of the first flat plate portion 101 and the third edge 102c of the second flat plate portion 102, or the fourth edge 101d of the first flat plate portion 101 and the fourth edge 102d of the second flat plate portion 102.

Referring to FIG. 6-9, the first fastening portion 1041 comprises a first extending portion 1041a. The second fastening portion 1042 comprises a second extending portion 1042a. The second extending portion 1042a comprises an inserting portion 105. The inserting portion 105 comprises a fixing end 1051 connected to the second extending portion 1042a and a free end 1052 extending from the fixing end 1051. A length L of the inserting portion 105 is defined as a distance between the fixing end 1051 and the free end 1052. The length L of the inserting portion 105 is greater than a distance D between the fixing end 1051 and a sidewall 1041b of the first extending portion 1041a facing the second extending portion 1042a. After folding the second flat plate portion 102 to the first flat plate portion 101 along the folding portion 103 to make the buffer layer 10b of the second flat plate portion 102 attach to one side of the display panel away from the first flat plate portion 101, the free end 1052 of the inserting portion 105 moves from one side of the first flat plate portion 101 facing the buffer layer 10b, through the a gap between the first extending portion 1041a and the second extending portion 1042a, and to one side of the first flat plate portion 101 facing the substrate layer 10a. The first extending portion 1041a avoids the inserting portion 105 from rebounding.

Figure 6:
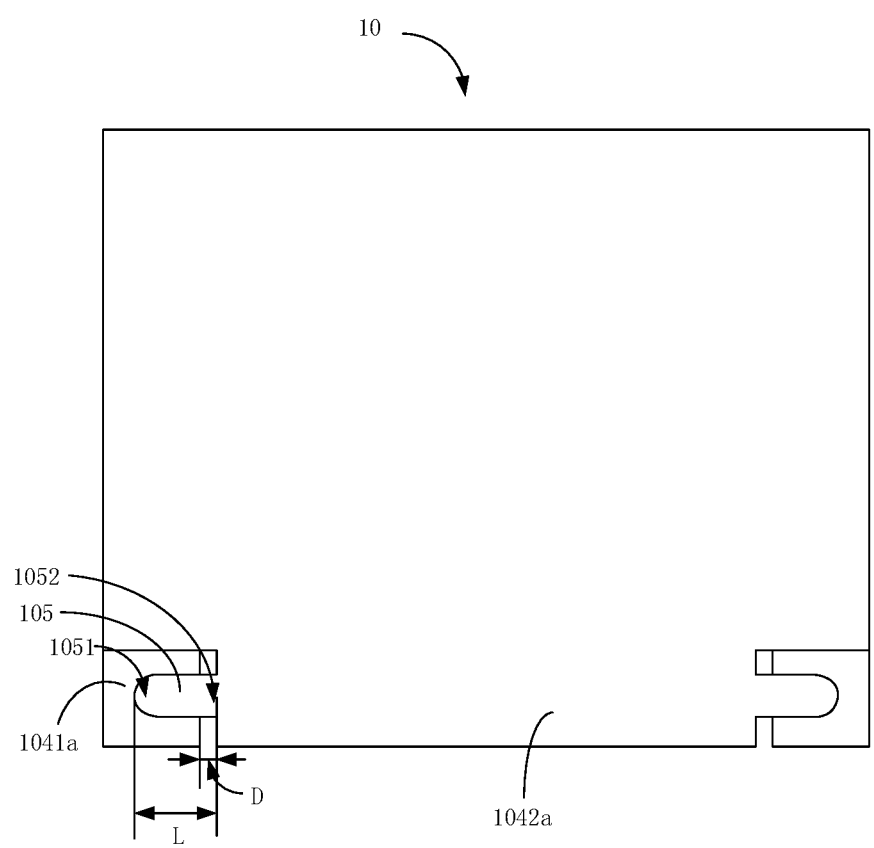
FIG. 6 is a top view of after folding a first flat plate portion and a second flat plate portion of a packaging structure according to a second exemplary embodiment of the present disclosure.

Referring to FIG. 6, the fixing end 1051 of the inserting portion 105 is formed at a sidewall 1042b of the second extending portion 1042a facing the first extending portion 1041a.

Figure 7:
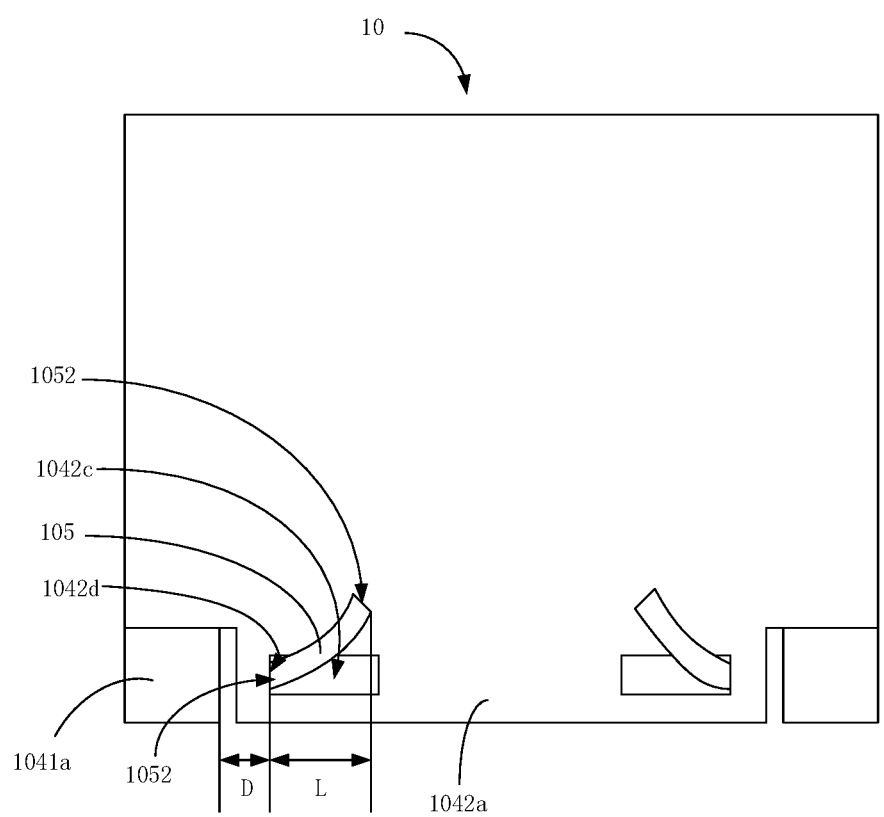
FIG. 7 is a top view of after folding a first flat plate portion and a second flat plate portion of a packaging structure according to a third exemplary embodiment of the present disclosure.

Referring to FIG. 7, the second extending portion 1042a comprises a through hole 1042c. The through hole 1042c is formed through the substrate layer 10a and the buffer layer 10b. The fixing end 1051 is formed at a sidewall 1042d of the through hole 1042c closed to the first extending portion 1041a.

Figure 8:
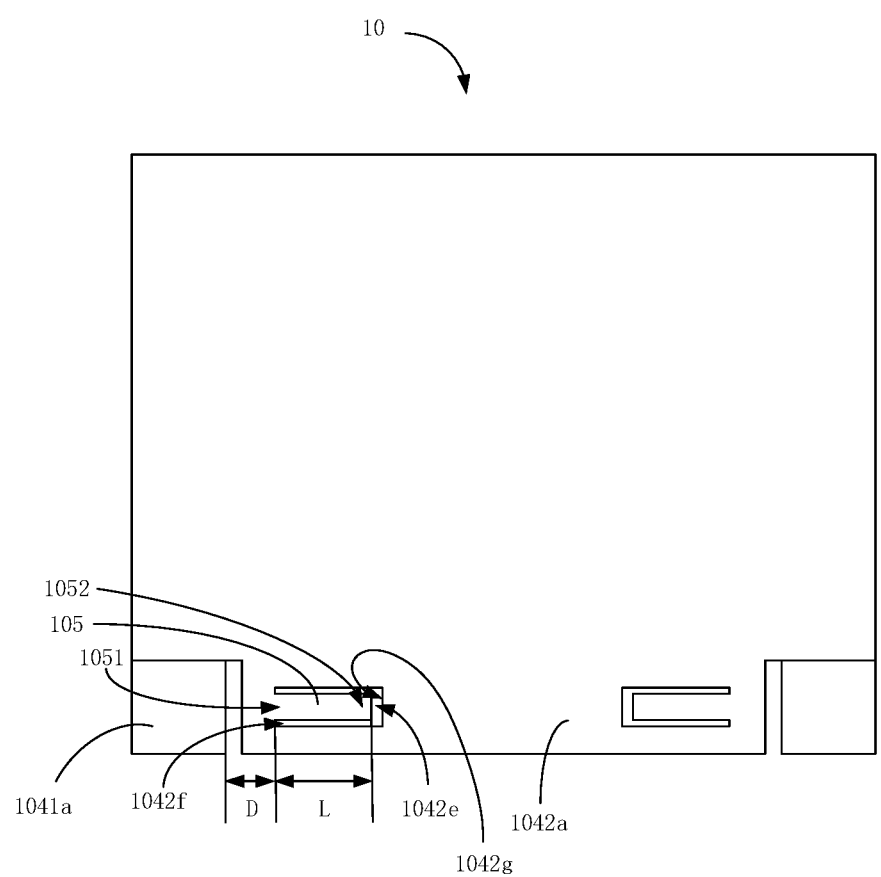
FIG. 8 is a top view of after folding a first flat plate portion and a second flat plate portion of a packaging structure according to a fourth exemplary embodiment of the present disclosure.
Figure 9:
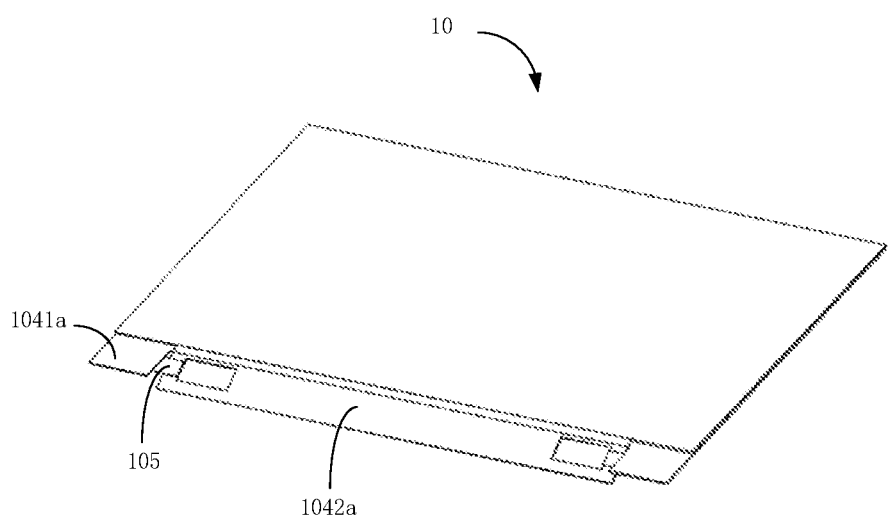
FIG. 9 is a structural diagram of after folding a first flat plate portion and a second flat plate portion of a packaging structure according to a fifth exemplary embodiment of the present disclosure.

Referring to FIG. 8, a U-shaped slit 1042e is formed at the second extending portion 1042a. The U-shaped slit 1042e has an opening 1042f facing the first extending portion 1041a. The fixing end 1051 is connected to the opening 1042f. The free end 1052 faces a sidewall 1042g of the U-shaped slit 1042e opposite to the opening 1042f.

Figure 10:
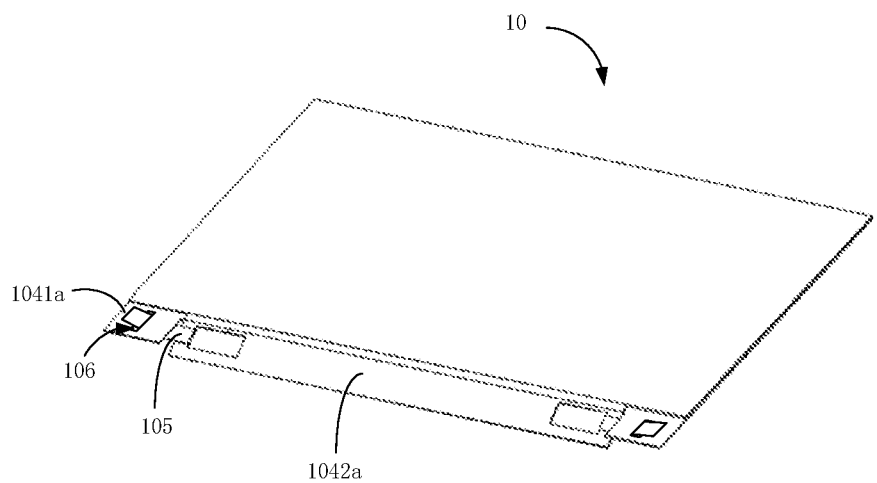
FIG. 10 is a structural diagram of after folding a first flat plate portion and a second flat plate portion of a packaging structure according to a sixth exemplary embodiment of the present disclosure.

In one exemplary embodiment, referring to FIG. 10, the first extending portion 1041a further comprises a penetrating hole 106. The penetrating hole 106 is formed through the substrate layer 10a and the buffer layer 10b. The length L of the inserting portion 105 is greater than a distance between the fixing end 1051 and a sidewall 106a of the penetrating hole 106 away from the second extending portion 1042a. After folding the second flat plate portion 102 to the first flat plate portion 101 along the folding portion 103 to make the buffer layer 10b of the second flat plate portion 102 attach to one side of the display panel away from the first flat plate portion 101, the free end 1052 of the inserting portion 105 moves from one side of the first flat plate portion 101 facing the buffer layer 10b, through the a gap between the first extending portion 1041a and the second extending portion 1042a, and to one side of the first flat plate portion 101 facing the substrate layer 10a, and then moves from the side of the first flat plate portion 101 facing the substrate layer 10a, through the penetrating hole 106, and to the side of the first flat plate portion 101 facing the buffer layer 10b. The penetrating hole 106 avoids the inserting portion 105 rebounding and strengthens strength of the fastening structure 104.

The penetrating hole 106 can be defined as a crevice. A width of the crevice is greater than a thickness of the substrate layer 10a and less than a thickness of the substrate layer 10a and the buffer layer 10b. After the inserting portion 105 moves through the penetrating hole 106, a thickness of the inserting portion 105 placed in the penetrating hole 106 is less than a thickness of the inserting portion 105 placed out of the penetrating hole 106 to strengthen strength of the fastening structure 104.

This application further provides a packaging method configured to package a display panel, the method comprises:

providing a display panel;

providing a packaging structure 10, the packaging structure 10 is as previously mentioned;

putting the display panel on the first flat plate portion 101 of the packaging structure 10, and placing the display panel on the buffer layer 10b;

folding the second flat plate portion 102 to the first flat plate portion 101 along the folding portion 103 to make the buffer layer 10b of the second flat plate portion 102 attach to one side of the display panel away from the first flat plate portion 101; and fastening the first fastening portion 1041 and the second fastening portion 1042 of the fastening structure 104.

In one exemplary embodiment, the step of fastening the first fastening portion 1041 and the second fastening portion 1042 of the fastening structure 104 can be: moving the free end 1052 of the inserting portion 105 from one side of the first flat plate portion 101 facing the buffer layer 10b, through a gap between the first extending portion 1041a and the second extending portion 1042a, and to one side of the first flat plate portion 101 facing the substrate layer 10a. The first extending portion 1041a avoids the inserting portion 105 rebounding.

In one exemplary embodiment, after the step of moving the free end 1052 of the inserting portion 105 from one side of the first flat plate portion 101 facing the buffer layer 10b, through a gap between the first extending portion 1041a and the second extending portion 1042a, and to one side of the first flat plate portion 101 facing the substrate layer 10a, the method further comprises: moving the free end 1052 of the inserting portion 105 from the side of the first flat plate portion 101 facing the substrate layer 10a, through the penetrating hole 106, and to the side of the first flat plate portion 101 facing the buffer layer 10b to avoid the inserting portion 105 rebounding.

Figure 11:
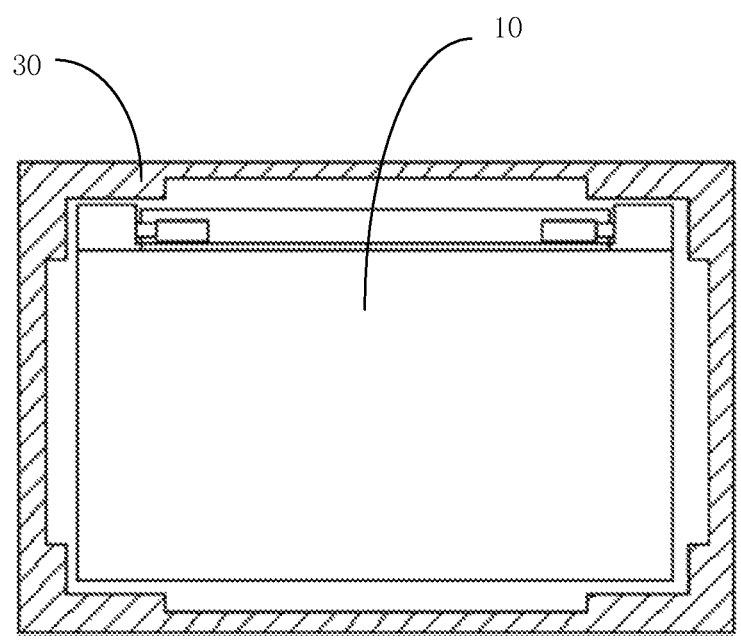
FIG. 11 is a structural diagram of a display panel placed in a packaging box of the present disclosure.

Referring to FIG. 11, after finishing packaging, the display panel packaged by the packaging structure 10 is put into a packaging box 30, a retaining wall can be formed in the packaging box 30, and the retaining wall is used to avoid the packaging structure 10 moving in the packaging box 30. The display panel cannot move corresponding to the packaging structure 10, so a panel body of the display panel, the flexible printed circuit board and the print circuit board cannot move opposite to each other to avoid breaking the flexible printed circuit board and chips arranged on the flexible printed circuit board and to protect the display panel.

The application provides a packaging structure and a packaging method, the packaging structure comprises a first flat plate portion, a second flat plate portion, a folding portion and a fastening structure. Both the first flat plate portion and the second plate portion have a substrate layer and a buffer layer. The buffer layer is formed on the substrate layer. The folding portion is connected between the first flat plate portion and the second flat plate portion. The first flat plate portion and the second flat plate portion are folded along the folding portion to make a display panel sandwiched between the buffer layer of the first flat plate portion and the buffer layer of the second flat plate portion. The substrate layer is used to support the display panel, and the buffer layer is used to reduce a force between the substrate layer and the display panel. The fastening structure fastens the first flat plate portion and the second flat plate portion to immobilize the first flat plate portion and the second flat plate portion and to ensure a stability of the packaging structure, and to immobilize a panel body of the display panel, a flexible printed circuit board and a print circuit board to avoid breaking the flexible printed circuit board and chips arranged on the flexible printed circuit board and to protect the display panel.

What is claimed is:

1. A packaging structure, the packaging structure being configured to package a display panel, wherein the packaging structure comprises:

a first flat plate portion, a second flat plate portion, a folding portion and a fastening structure, wherein both the first flat plate portion and the second flat plate portion have a substrate layer and a buffer layer, wherein the buffer layer is formed on the substrate layer;

the folding portion is connected between the first flat plate portion and the second flat plate portion, the folding portion is configured to fold the first flat plate portion and the second flat plate portion to make the display panel sandwiched between the buffer layer of the first flat plate portion and the buffer layer of the second flat plate portion;

the fastening structure comprises a first fastening portion and a second fastening portion fastened to the first fastening portion, the first fastening portion is formed at one side of the first flat plate portion, the second fastening portion is formed at one side of the second flat plate portion;

the buffer layer of the first flat plate portion and the buffer layer of the second flat plate portion are connected with each other at the folding portion; and the substrate layer of the first flat plate portion and the substrate layer of the second flat plate portion are not connected with each other at the folding portion.

2. The packaging structure of claim 1, wherein the first fastening portion comprises a first extending portion; the second fastening portion comprises a second extending portion; the second extending portion comprises an inserting portion; the inserting portion comprises a fixing end connected to the second extending portion and a free end extending from the fixing end; a length of the inserting portion is greater than a distance between the fixing end and a sidewall of the first extending portion facing the second extending portion.

3. The packaging structure of claim 2, wherein the fixing end of the inserting portion is formed at a sidewall of the second extending portion facing the first extending portion.

4. The packaging structure of claim 2, wherein the second extending portion comprises a through hole; the through hole is formed through the substrate layer and the buffer layer; the fixing end is formed at a sidewall of the through hole closed to the first extending portion.

5. The packaging structure of claim 2, wherein a U-shaped slit is formed at the second extending portion; the U-shaped slit has an opening facing the first extending portion; the fixing end is connected to the opening; the free end faces a sidewall of the U-shaped slit opposite to the opening.

6. The packaging structure of claim 2, wherein the first extending portion further comprises a penetrating hole; the penetrating hole is formed through the substrate layer and the buffer layer.

7. The packaging structure of claim 3, wherein the first extending portion further comprises a penetrating hole; the penetrating hole is formed through the substrate layer and the buffer layer.

8. The packaging structure of claim 4, wherein the first extending portion further comprises a penetrating hole; the penetrating hole is formed through the substrate layer and the buffer layer.

9. A packaging structure, the packaging structure being configured to package a display panel, wherein the packaging structure comprises:
a first flat plate portion, a second flat plate portion, a folding portion and a fastening structure; wherein both the first flat plate portion and the second flat plate portion have a substrate layer and a buffer layer, wherein the buffer layer is formed on the substrate layer;
the folding portion is connected between the first flat plate portion and the second flat plate portion, the folding portion is configured to be folded the first flat plate portion and the second flat plate portion to make the display panel sandwiched between the buffer layer of the first flat plate portion and the buffer layer of the second flat plate portion;
the fastening structure comprises a first fastening portion and a second fastening portion fastened to the first fastening portion, the first fastening portion is formed at one side of the first flat plate portion, the second fastening portion is formed at one side of the second flat plate portion.

10. The packaging structure of claim 9, wherein the first fastening portion comprises a first extending portion; the second fastening portion comprises a second extending portion; the second extending portion comprises an inserting portion; the inserting portion comprises a fixing end connected to the second extending portion and a free end extending from the fixing end; a length of the inserting portion is greater than a distance between the fixing end and a sidewall of the First extending portion facing the second extending portion.

11. The packaging structure of claim 10, wherein the fixing end of the inserting portion is formed at a sidewall of the second extending portion facing the first extending portion.

12. The packaging structure of claim 10, wherein the second extending portion comprises a through hole; the through hole is formed through the substrate layer and the buffer layer; the fixing end is formed at a sidewall of the through hole closed to the first extending portion.

13. The packaging structure of claim 10, wherein a U-shaped slit is formed at the second extending portion; the U-shaped slit has an opening facing the first extending portion; the fixing end is connected to the opening; the free end faces a sidewall of the U-shaped slit opposite to the opening.

14. The packaging structure of claim 10, wherein the first extending portion further comprises a penetrating hole; the penetrating hole is formed through the substrate layer and the buffer layer.

15. The packaging structure of claim 11, wherein the first extending portion further comprises a penetrating hole; the penetrating hole is formed through the substrate layer and the buffer layer.

16. The packaging structure of claim 12, wherein the first extending portion further comprises a penetrating hole; the penetrating hole is formed through the substrate layer and the buffer layer.

17. The packaging structure of claim 13, wherein the first extending portion further comprises a penetrating hole; the penetrating hole is formed through the substrate layer and the buffer layer.

18. A packaging method configured to packaging a display panel, comprises:
providing a display panel;
providing a packaging structure, wherein the packaging structure comprises a first flat plate portion, a second flat plate portion, a folding portion and a fastening structure;
wherein both the first flat plate portion and the second flat plate portion have a substrate layer and a buffer layer, the buffer layer is formed on the substrate layer, the folding portion is connected between the first flat plate portion and the second flat plate portion, the folding portion is configured to fold the first flat plate portion and the second flat plate portion to make the display panel sandwiched between the buffer layer of the first flat plate portion and the buffer layer of the second flat plate portion, the fastening structure comprises a first fastening portion and a second fastening portion fastened to the first fastening portion, the first fastening portion is formed at one side of the first flat plate portion, the second fastening portion is formed at one side of the second flat plate portion;
putting the display panel on the first flat plate portion of the packaging structure, and placing the display panel on the buffer layer;
folding the second flat plate portion to the first flat plate portion along the folding portion to make the buffer layer of the second flat plate portion attach to one side of the display panel away from the first flat plate portion; and
fastening the first fastening portion and the second fastening portion of the fastening structure.

19. The packaging method of claim 18, wherein the first fastening portion comprises a first extending portion, the second fastening portion comprises a second extending portion, the second extending portion comprises an inserting portion, the inserting portion comprises a fixing end connected to the second extending portion and a free end extending from the fixing end, a length of the inserting portion is greater than a distance between the fixing end and a sidewall of the first extending portion facing the second extending portion, and the step of fastening the first fastening portion and the second fastening portion of the fastening structure is:

moving the free end of the inserting portion from one side of the first flat plate portion facing the buffer layer, through a gap between the first extending portion and the second extending portion, and to one side of the first flat plate portion facing the substrate layer.

20. The packaging method of claim 19, wherein the first extending portion further comprises a penetrating hole, the penetrating hole is formed through the substrate layer and the buffer layer, and the step of fastening the first fastening portion and the second fastening portion of the fastening structure further comprises:

moving the free end of the inserting portion from the side of the first flat plate portion facing the substrate layer, through the penetrating hole, and to the side of the first flat plate portion facing the buffer layer.

\* \* \* \* \*